US005902675A

United States Patent [19]
Pinneo

[11] Patent Number: 5,902,675
[45] Date of Patent: May 11, 1999

[54] DIAMOND FILM AND SOLID DIAMOND PARTICLE COMPOSITE COMPOSITIONS

[75] Inventor: John M. Pinneo, Redwoodcity, Calif.

[73] Assignee: Crystallume, Santa Clara, Calif.

[21] Appl. No.: 08/327,355

[22] Filed: Oct. 20, 1994

Related U.S. Application Data

[60] Division of application No. 07/704,997, May 24, 1991, abandoned, which is a continuation-in-part of application No. 07/413,114, Sep. 27, 1989, Pat. No. 5,075,095, which is a continuation of application No. 07/204,058, Jun. 7, 1988, Pat. No. 4,882,138, which is a continuation of application No. 07/032,169, Mar. 30, 1987, abandoned.

[51] Int. Cl.$^6$ ........................................... B32B 9/00
[52] U.S. Cl. .................... 428/323; 428/408; 428/304.4; 428/312.2; 428/317.9; 428/318.4; 428/319.1
[58] Field of Search ..................... 428/408, 323, 428/304.4, 312.2, 317.9, 318.4, 319.1

[56] References Cited

U.S. PATENT DOCUMENTS

| | | | |
|---|---|---|---|
| 4,104,441 | 8/1978 | Fedoseev et al. | 428/408 |
| 4,231,762 | 11/1980 | Hara et al. | 51/309 |
| 4,925,701 | 5/1990 | Jansen et al. | 427/38 |
| 4,987,002 | 1/1991 | Sakamoto et al. | 427/34 |

FOREIGN PATENT DOCUMENTS

| | | |
|---|---|---|
| 55-62850 | 5/1980 | Japan . |
| 55-62851 | 5/1980 | Japan . |

Primary Examiner—A. A. Turner
Attorney, Agent, or Firm—D'Alessandro & Ritchie

[57] ABSTRACT

Porous and non-porous compositions include diamond particles, non-diamond particles, or mixtures of particles consolidated with polycrystalline diamond. The composite compositions of the present invention may be formed by a process which includes the steps of preforming the particles into a preform having a desired shape, and consolidating the preform with polycrystalline diamond. The polycrystalline diamond is preferably formed using CVD techniques including application of sufficient microwave energy to maintain the preform at a temperature of between about 670° and 850° C. The preform may be rotated during a portion of the deposition process.

11 Claims, 4 Drawing Sheets

DIAMOND FILM AND SOLID DIAMOND PARTICLE COMPOSITE COMPOSITIONS

RELATED APPLICATIONS

The present application is a division of co-pending application Ser. No. 07/704,997, filed May 24, 1991 now abandoned, which is a continuation in part of my previous application Ser. No. 07/413,114, filed Sep. 27, 1989 now U.S. Pat. No. 5,075,095, which is a continuation of application Ser. No. 07/204,058, filed Jun. 7, 1988, now U.S. Pat. No. 4,882,138, which is a continuation of application Ser. No. 07/032,169, filed Mar. 30, 1987, now abandoned.

BACKGROUND OF THE INVENTION

1. Field of the Invention

The present invention relates to compositions of diamond and non-diamond particulate solid materials consolidated with polycrystalline diamond, and to methods for manufacturing these materials.

2. The Prior Art

The advent of methods for formation of polycrystalline diamond films has opened up a wide variety of new applications for diamond as an engineering material. Thin ($\approx$400 Å) films of this new material have become the basis for commercially available X-ray detector windows (sold By Crystallume of Menlo Park Calif.), while thicker diamond films (typically 0.3–0.5 mm) are being used to enhance the power dissipation capabilities of thermally-limited electronic devices such as laser diodes, laser diode arrays, and microwave power amplifier transistors.

While solid diamond films, produced by chemical vapor deposition methods, are finding increasing commercial utility, cost is still a barrier to their radiation into wider use. In particular, for applications which require very thick sections and/or which require fabrication of complex shapes, the polycrystalline CVD diamond materials are often prohibitively expensive, due to the excessive deposition time required to grow thick sections, and/or due to the extreme expense of mechanically fabricating diamond, the hardest known substance.

Earlier attempts at consolidation of diamond particles using diamond CVD are known in the art. The earliest known of these were experiments by William G. Eversole, which consisted of passage of methane gas over heated diamond dust. These experiments, which led to an issued U.S. Pat. No. 3,030,188, produced only a thin, hard, mainly graphitic crust of deposited material on the exterior of the diamond powder mass, leaving the interior unconsolidated.

Other later attempts by Japanese researchers involving pyrolysis of methane and/or benzene on heated diamond dust led essentially to the same nonutilitarian results achieved by Eversole, and did not demonstrate a useful degree of consolidation of particles (Matsumoto, S; and Setaka, N; Consolidation of Diamond Powders by Thermal Decomposition of Methane and Benzene; *Journal of Materials Science*, vol. 15, pp. 1333–1336).

The lack of success in these attempts at consolidation of particulates by formation of a matrix of diamond material stimulated development of alternate technologies, including use of "glues" (such as liquid metals) which are infiltrated into the particulate mass liquid form and allowed to solidify through freezing and shock-consolidation methods, in which explosively generated shock waves pass through a diamond particulate mass and briefly melt the diamond particles, with solidification and partial consolidation occurring after passage of the shock wave (Potter, David K.; Ahrens, Thomas, J.; Dynamic Consolidation of Diamond Powder into Polycrystalline Diamond, *Applied Physics Letters* 51 (51), Aug. 3, 1987, pp. 317–319). This technology has not been capable of producing commercially useful diamond composite or consolidated objects due to its inability to generate large pieces (e.g., volumes $\geq\sim 1$ cm$^3$) without cracks and other structural flaws.

BRIEF DESCRIPTION OF THE INVENTION

This application describes a new class of diamond composite material in which particulates consisting in part or in whole of matrix of polycrystalline diamond material or other material using chemical vapor deposition (CVD) techniques. As will be describe herein, this approach enables the rapid, cost-effective, production of diamond materials of arbitrary thickness, and which exhibit complex shapes and topologies in their as-grown state, necessitating little or no post-consolidation machining operations.

Application requirements which can now be filled using composite diamond materials as described herein include large area electronic packaging (e.g., multichip modules), ceramic turbine blades and rotors (e.g., automotive turbochargers and jet engine components), precision gauge blocks, and corrosion-proof porous ceramic filters. According to a first aspect of the present invention, both porous and non-porous compositions include diamond particles consolidated with polycrystalline diamond.

According to a second aspect of the present invention, both porous and non-porous compositions include non-diamond solid particles consolidated with polycrystalline diamond. The solid particles may include any material which is compatible with polycrystalline diamond deposition techniques.

According to a third aspect of the present invention, both porous and non-porous compositions include mixtures of different solid particles and composite particles consolidated with polycrystalline diamond. The solid particles may include diamond or any material which is compatible with polycrystalline diamond deposition techniques.

According to yet another aspect of the present invention, the diamond and non-diamond particle compositions of the present invention may be formed by a process which includes the steps of arranging the particles into a preform having a desired shape, and consolidating the preform with polycrystalline diamond. The polycrystalline diamond is preferably formed using CVD techniques including application of sufficient energy to maintain the preform at a temperature of between about 670° and 850° C. The preform may be rotated during a portion of the deposition process.

DETAILED DESCRIPTION OF A PREFERRED EMBODIMENT

Figure 1:
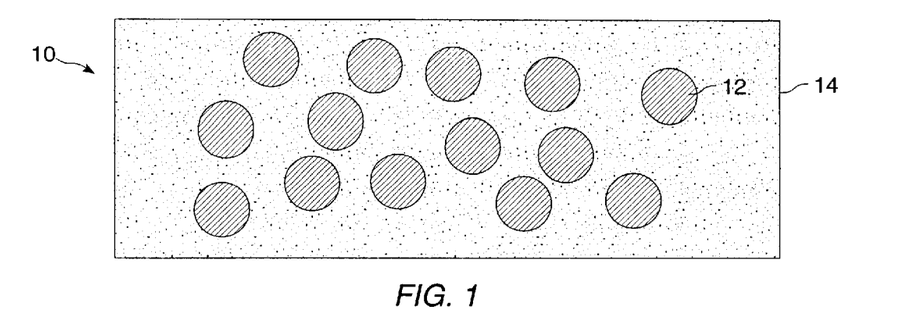
FIG. 1 is a schematic representation of a cross sectional view of a diamond consolidated particle composition according to the present invention.

The present invention includes both porous and non-porous compositions including diamond and non-diamond particles consolidated with polycrystalline diamond. FIG. 1 is a schematic representation of a cross sectional view of a diamond consolidated particle composition 10 according to the present invention showing particles 12 consolidated by diamond 14.

Figure 2:
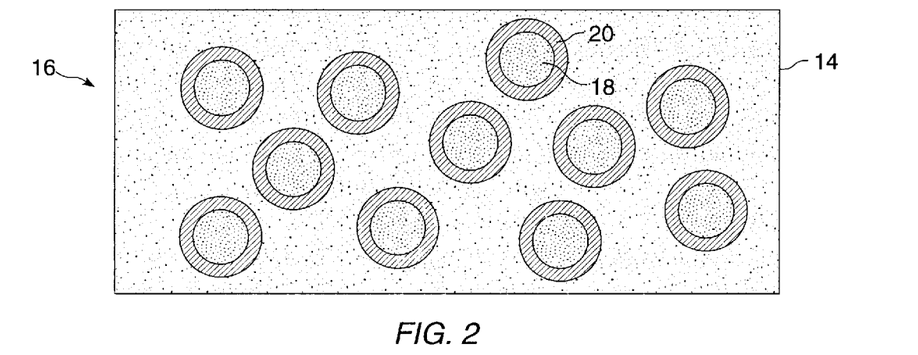
FIG. 2 is a schematic representation of a cross sectional view of a diamond consolidated composite particle composition according to the present invention.

The particles may be either solid particles or composite particles, i.e., particles formed from a first material coated with a layer of a second material. While FIG. 1 shows a composition comprising solid particles, FIG. 2 shows a composition 16 in which particles 18 are first coated with a layer 20 of different material and consolidated by diamond 14.

The particles (or the surface portion of composite particles) may comprise any material which is compatible with polycrystalline diamond deposition techniques. It is presently contemplated that particles comprised of materials which work well for diamond deposition as substrates in regular flat surface form, including, but not limited to, diamond, silicon nitride, tungsten, tungsten carbide, molybdenum, silicon, and aluminum will provide suitable particle substrates for consolidation into the compositions of the present invention. It is believed that particulate quartz and alumina may also be consolidated according to the present invention. Particle mixtures of different materials are also consolidated within the scope of the present invention. It has been demonstrated that diamond and silicon carbide particles may be consolidated into porous and non-porous articles according to the present invention.

According to one embodiment of the present invention, enhancement of thermal conductivity and strength of polycrystalline diamond compact, such as that sold under the trade name Compax by GE superabrasives of Worthington, Ohio, are accomplish by further consolidating it using the present invention. This starting compact material is created by first metal-coating diamond particles and then pressing them together under high pressure and temperature. The metal coating melts and allows the underlying diamond grains to grow partially together. After cooling, the metal matrix may be leached away with a solvent, such as an acid or mixture of acids, leaving a porous network of diamond particles. Consolidation of this material according to the present invention further enhances the physical properties of this material.

The consolidation process of the present invention may be used to consolidate a broad range of particle sizes. Particle sizes of 0 to 5 microns in diameter and particle sizes above 5 microns in diameter may be consolidated utilizing the present invention. It is presently believed that the optimum particle and pore size will depend on the application to which the finished product will be put. For example, the particle and pore size distribution which is best for maximum consolidation will probably be less useful for producing a porous material for use as a filter. Generally, if the particles are too small, the surface will grow over with a solid diamond layer and terminate growth in the interior. If the particles are too large, impractically long deposition times may be required to achieve good consolidation because pore sizes will be large. This consideration will also effect the size of the objects to be fabricated according to the present invention. The center of thicker objects must be assured of consolidation prior to the completion of surface consolidation which cuts off the flow of reactant gases.

Diamond particles of $10\mu$ and $100\mu$ and silicon carbide particles of $100\mu$ in diameter have been successfully consolidated at an average deposition rate of approximately $1\mu$/hour. At this deposition rate, the $100\mu$ particles form better compositions than the $10\mu$ particles because deposition at and immediately adjacent to the surface of the $10\mu$ particles causes premature closure of the surface porosity (i.e., within about 6–10 hours), resulting in cessation of deposition, and therefore of consolidation, within the interior of the material.

Figure 3A:
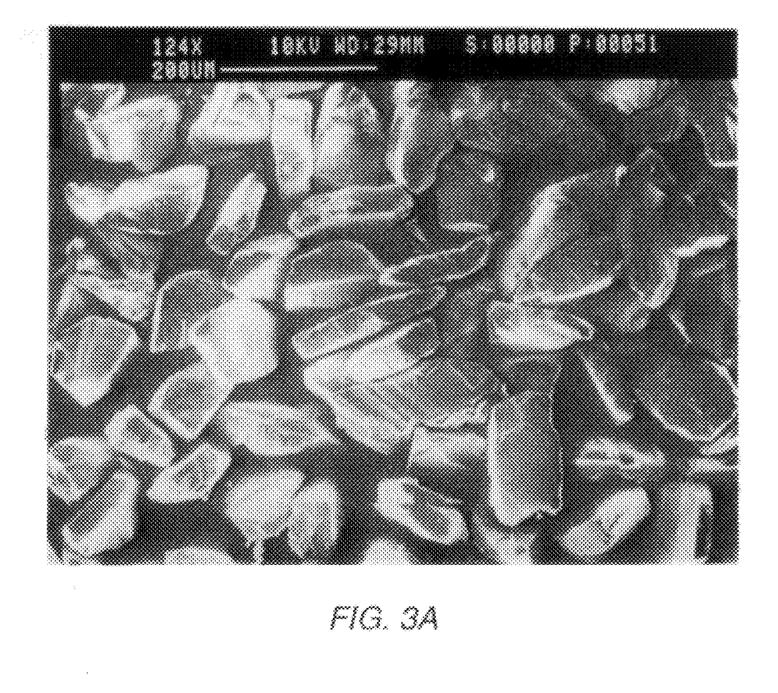
FIG. 3a is a scanning electron micrograph of diamond particles prior to consolidation with diamond according to the present invention.
Figure 3B:
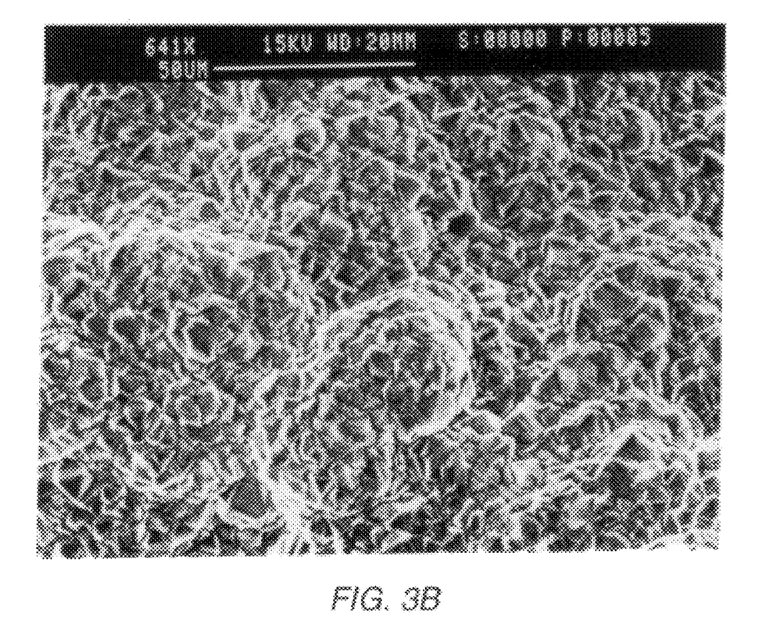
FIG. 3b is a scanning electron micrograph of diamond particles consolidated with diamond according to the present invention.

FIGS. 3a and 3b are scanning electron micrographs of diamond particles shown, respectively, prior to and after consolidation with diamond according to the present invention. The effect of the diamond coating may be seen in FIG. 3b.

Figure 4A:
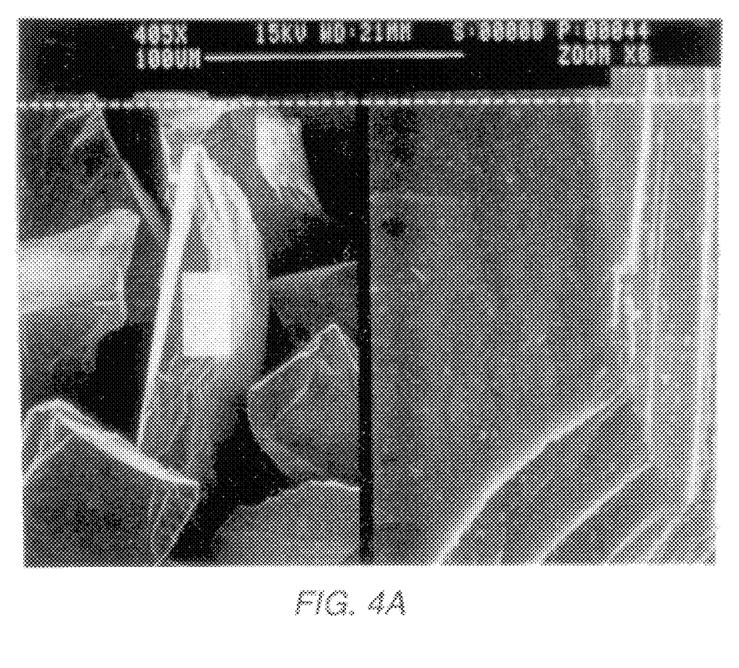
FIG. 4a is a scanning electron micrograph of silicon carbide paricles prior to consolidation with diamond according to the present invention.
Figure 4B:
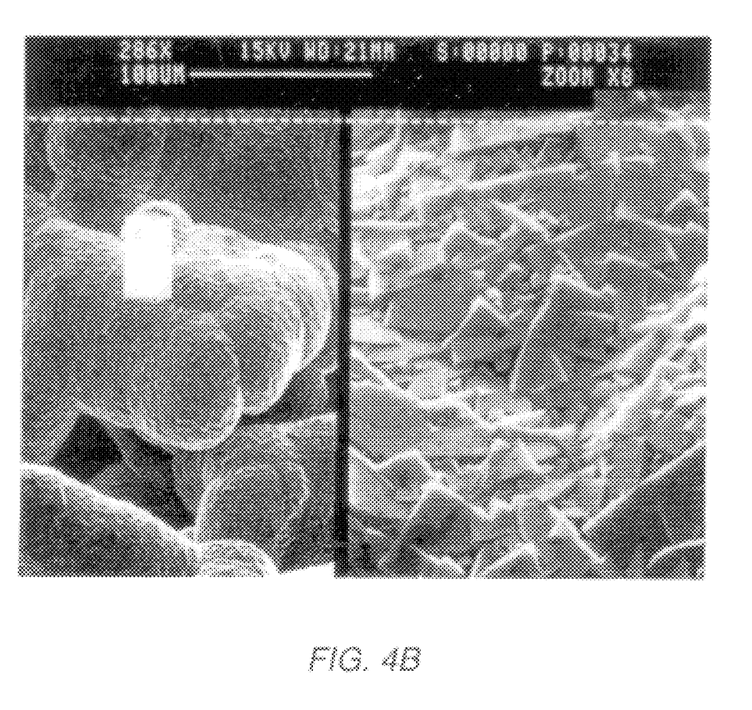
FIG. 4b is a scanning electron micrograph of silicon carbide particles consolidated with diamond according to the present invention.

FIGS. 4a and 4b are scanning electron micrographs of silicon carbide particles shown, respectively, prior to and after consolidation with diamond according to the present invention. The effect of the diamond coating may be seen in FIG. 4b.

Consolidation tests have been performed using irregularly shaped (i.e., particles with fracture surfaces and aspect ratios of up to about 3 to 1) particles of natural diamond dust and ordinary synthetic silicon carbide abrasive particles. The tests demonstrate that irregularly shaped particles work well with the current invention. Recent CVI modelling work, S. M. Gupte and J. A. Tsammopoulos, Forced Flow Chemical Vapor Deposition of Porous Ceramic material, *J. Electrochem. Soc.*, Vol. 137, No. 11, November 1990, pp. 3675–3682 indicates that pore size distribution (which is strongly influenced by particle size and shape) critically determines the degree of densification achievable and processing time required. It is presently believed that a uniform pore size leads to the greatest densification under forced flow conditions.

Particle shape will also affect the properties of the finished composite. If particles have a large length/diameter ratio (in excess of about 7/1), they will behave more like fibers and may improve the fracture toughness of the composite material. Other properties, like scattering of polarized light, and directionality of thermal conductivity, may also be affected by use of fiber-like particles.

The present invention also contemplates consolidation of mixtures of diamond and non-diamond particles. Varying the proportions of diamond and non-diamond particles in compositions made according to the present invention allows for the control of important physical properties of the resulting material. For example, thermal expansion, and thermal and electrical conductivity of compositions made according to the present invention may be controlled by altering the ratio of diamond to non-diamond particles from which the composition is made. At a given porosity, the thermal impedance of the composition will be approximatelly the weighted average of the thermal impedances of the component materials, weighted by volume percent of composition.

In some circumstances, it may be desirable or necessary to employ particles or fibers which are themselves composites of two or more materials. For example, nickel and iron are poisonous to the diamond deposition process. Consequently, if it is desired to consolidate nickel or iron particles with diamond material, it may be necessary to coat each particle prior to final diamond consolidation with a material which presents a hospitable surface for diamond deposition. Thus a thin layer of metal such as molybdenum or ceramic such as silicon carbide, both of which are known to support diamond deposition, may be applied to the iron or nickel particles to prepare them for consolidation with diamond as earlier described. Additional areas of utility for composite particles as precursors to densify with diamond include modification of electrical, thermal, or mechanical properties through use of appropriate coatings.

A similar process may be used to form composite fibers which may then be used for consolidation with diamond. In this instance, use of composite fibers not only allows use of inhospitable fiber materials and/or modification of selected properties, but also makes available composite fibers which are substantially all diamond for use as elements in the manufacture of a diamond-fiber-reinforced, diamond-consolidated composite material.

For example, when $5\mu$ fibers of silicon nitride (HPZ silicon nitride, available from Dow Corning) are coated with approximately $25\mu$ of diamond through chemical vapor deposition means, a $50\mu$ diameter fiber is formed whose greater portion consists of diamond, and whose properties are substantially those of a pure diamond fiber. This is useful because current technology does not permit the economic manufacture of pure diamond fibers.

Because a critical factor in determining the mechanical properties of fiber reinforced materials is the behavior of the interface between the fiber and the surrounding matrix, it may be desireable to modify the surface chemistry of a diamond composite fiber by applying an outer overcoat layer of an appropriate material. For example, use of a silicon carbide overcoat or a thin metal layer such as molybdenum will increase the adhesive strength between the diamond composite fiber and the surrounding matrix.

Figure 5:
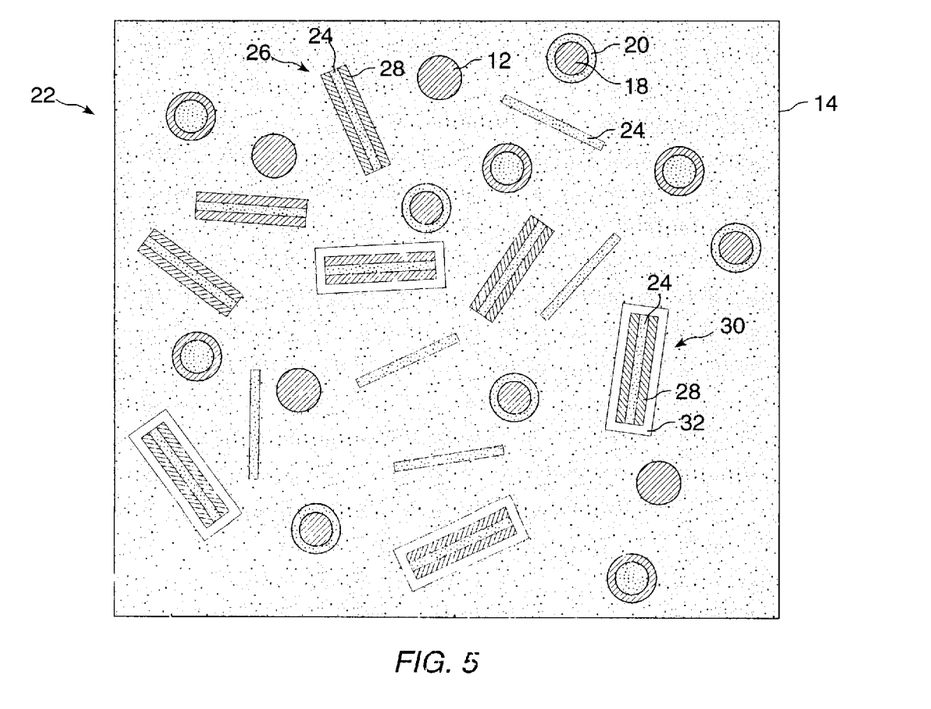
FIG. 5 is a schematic representation of a cross sectional view of a diamond consolidated fiber composition according to the present invention.

FIG. 5 is a schematic representation of a cross sectional view of a mixed fiber and particle composition 22 consolidated with polycrystalline diamond 14. Non-diamond fibers, for example silicon carbide, silicon nitride, or alumina, are shown at reference numeral 24. Diamond-consolidated fibers are shown at reference numeral 26 coated with a layer of diamond 28. Diamond-consolidated fibers, coated with a layer of diamond 28 and overcoated with non-diamond layer 32, comprising substances, for example quartz, silicon carbide, silicon nitride, or alumina, are shown at reference numeral 30. For illustrative purposes only, the composition 22 of FIG. 5 is shown comprising several types of fibers and particles which may be consolidated according to the present invention. Those of ordinary skill in the art will recognize that an actual composition 22 formed according to the present invention may contain one or more of the types of particles and/or fibers actually shown in FIG. 5.

There appears to be no inherent limitation regarding the ratio of diamond to non-diamond particles which may be consolidated according to the present invention, so long ask the material of which the non-diamond particles are comprised is compatible with diamond deposition, and is of a size range which will allow proper consolidation. With respect to size range ratios, there will be various optimum particle size distributions depending on specific process operating conditions. By properly tailoring the pore size distribution as a function of position within the mass being consolidated to compensate for deposition rate differences, it may be possible to achieve higher densificaition than with a simple uniform pore size distribution.

For example, a higher overall degree of consolidation may be achieved by fabricating reforms such that pores most distant from the source of reactant gases are smaller than those closest to the source of reactant gases. This average reduction of pore size with increasing distance from the reactant gas source compensates for the reduction in growth rate which occurs with increasing distance from reactants. This technique may be used in combination with imposed thermal gradients and/or controlled gas flow methods, but is particularly useful when thermal gradients and/or controlled gas flow techniques cannot be employed due to specific application or engineering requirements One major controlling factor in the process according to the present invention is the deposition rate. For example, if the average particle and pore size are about $100\mu$, a growth rate of $1\ \mu/hr$ will close off the average pore in 50 hours. A presently preferred maximum growth rate is about 1% of the average particle size, expressed in microns/hr. Thus, a particle preform having average particle sizes of about $100\mu$ can be consolidated using a process with a deposition rate of about $1\ \mu/hr$. This is a rule of thumb rather than a hard and fast rule, and departures from this rule will be fairly common, depending on particle shape, whether more than one particle size is present, and on whether thermal gradients and gas flows in the process are arranged to modify local deposition rates.

For example, a way to increase the degree of consolidation of a composition according to the present invention is to arrange for the region most distant from the plasma or other reactant source to be the hottest. Because deposition rate is a strong function of temperature, this compensates for the tendency for the regions nearest to the plasma to grow more quickly, and postpones premature termination of consolation resulting from closure of gas diffusion passages. Under these circumstances, a faster deposition rate may be useable.

Although the foregoing discussion of consolidation of particulates by chemical vapor infiltration has focused on the use of polycrystalline diamond as a matrix material, those of ordinary skill in the art will recognize that operative embodiments of the present invention can be used to consolidate diamond particles in the variety of forms discussed herein by chemical vapor infiltration of non-diamond matrix materials such as silicon carbide. This process produces a further variety of diamond composite materials having desireable properties and broadens the commercial utility and application of diamond composite materials. A specific example of such a system is the consolidation of diamond particles by chemical vapor infiltration of silicon carbide matrix material, using methane and silane gas chemistry as is well known in the art.

According to a presently preferred embodiment of the present invention, a composition comprising polycrystalline diamond and either diamond or non-diamlond solid or composite particles may be fabricated using CVI) techniques. Those of ordinary skill in the art will recognize that, while the preferred embodiment disclosed herein utilizes microwave power, other sources of energy, such as combustion flames, plasma torches, etc., may be used to drive the deposition of diamond. The present invention contemplates formation of the composite material using any known diamond deposition process.

The particle substrate material is first selected. Natural diamond powder, such as 100µ type N diamond powder available from Flat-Tech Systems of Glenview, Illinois, or commercial silicon carbide abrasive powder, such as Meccarb Nero grana P 225 available from Samatec of Milan, Italy have been successfully employed in the practice of the present invention. Where diamond particles are to be consolidated, natural diamond is preferred in order to avoid impurities which are sometimes present in the high-pressure, high-temperature synthetics which reduce thermal conductivity.

The particles may be precleaned by rinsing them with isopropyl alcohol and drying them on filter paper. The particles may then be premixed as required. To prepare particle mixtures, the appropriate amounts are weighed out in the dry state and the weighted amounts are transferred into a beaker or crucible for subsequent mixing.

Small amounts of a liquid, such as isopropyl alcohol or polyvinyl alcohol are preferably added to the dry particle mix to form a pourable slurry. The properties of the ideal slurry-forming liquid, or vehicle, include somewhat elevated viscosity (to prevent rapid settling of particles after mixing) and complete, residue-free evaporation from the slurry after pouring into a mold.

The slurry is then poured into a mold having the desired shape of the finished consolidated article and the slurry vehicle is allowed to evaporate, either unaided, or with the assistance of vacuum and/or heat, to leave a particle preform. Too rapid vehicle removal causes bubble or void formation in the finished preform. For uniform thickness, the mold must be kept level. This is especially important for thin, wide items, as slight tilts cause the slurry to pile up at one side of the mold.

On the other hand, deliberate mold tilting may be employed to obtain linear thickness variation if desired. In addition, a circular mold may be spun to obtain a parabolic thickness distribution through the interaction of centrifugal force and gravity.

Mold material and surface finish can be important, depending on the desired result. Ideally, a mold should be made of a material to which diamond does not strongly adhere or grow upon, to ease post-deposition mold separation. The mold surface texture is replicated in the adjacent consolidated material, so smooth finishes may be obtained in the completed material if a mold with a polished surface is employed. Molds can also include shapes of various type which give contour and relief to the finished material. This an especially important capability in that it reduces or eliminates the need for post-deposition machining, an important cost-reduction consideration in view of the hardness of the finished product.

A circular copper gasket with an inner diameter of 2.25 inches centered on the polished surface of a silicon wafer has been shown to function satisfactorily as a mold. A copper gasket about 2 mm thick has been employed, although other thicknesses may be employed. The gasket is simply placed on the wafer and is kept in place by gravity. The silicon surface is extremely flat and smooth, and is compatible with the diamond deposition environment. It is easily etched away following deposition.

The isopropyl alcohol vehicle may be removed by evaporation accelerated with gentle heating. The mold is placed on a levelled hot plate, and the slurry is poured into the mold. Generally, the seal between the copper gasket and the wafer surfaces is good enough that very little liquid leaks out. The particles are too large to be carried along small leak paths. After the slurry is poured and levelled (if needed), the hot plate is turned on and the slurry temperature is allowed to increase to about 40–45° C. Evaporation takes about 2 hours.

When the vehicle has evaporated, the copper gasket is carefully removed by lifting it vertically off the wafer. This leaves a disc of loosely-bound particles on the wafer. The copper gasket is removed because copper is not compatible with the diamond deposition process. The preform particle composite disc is placed, still on the underlying wafer, in a diamond deposition system. Any deposition system capable of producing diamond may be used.

The polycrystalline diamond deposition process is preferably carried out in a CVD reactor capable of depositing diamond, such as a model HPMS, available from Applied Science and Technology, Inc., of Woburn, Massachusetts. According to a presently preferred embodiment of the invention, deposition proceeds in two stages.

The two deposition stages differ with respect to sample motion. During the first stage, the sample is stationary because it does not have the mechanical integrity to withstand rotation. During the second stage, the sample is strong enough to endure rotation when spun at up to 600 rpm. The rotational motion substantially increases deposition area and uniformity by reducing temperature gradients in the preform article.

During the first stage of deposition, a mixed gas containing hydrogen (99.9995+% purity) at a flow rate of between about zero and, 10 slm, preferably about 150 sccm, and methane (99.99+% purity) at a flow rate of between about 0.001 sccm and 1,000 sccm, preferably about 0.75 sccm is introduced into the deposition chamber at a pressure of between about 0.5 and 100 torr. While it is presently preferred to conduct the deposition in the presence of a carbon-containing gas, it is believed that even without addition of methane or another carbon bearing gas, some diamond carbon will be gassified by the hydrogen plasma and will redeposit as diamond. The chamber is preferably pumped down slowly (over about a five minute period) to avoid explosively decompressing the preform article through rapid release of entrapped gases. Similarly, the gas flow into the chamber is initiated slowly to avoid blowing the unconsolidated powder of the preform all over the interior of the chamber.

A plasma is ignited using about 800 watts of microwave energy at a frequency of above about 50 Mhz, preferably about 2.45 Ghz in a manner well known in the art. Following the establishment of a stable plasma, pressure is increased over a period of about two minutes until a pressure of about 60 torr is obtained. Simultaneously, microwave power is increased to maintain the temperature of the preform article to between, about 600° C. and 850° C. Typical microwave power levels necessary to achieve this operating substrate temperature are from about between 800 to 1,500 watts, and depend on the specific composition and dimensions of the preform article to be densified. For example, a 3 mm thick, 2.25 inch diameter preform consisting of diamond particles required approximately 1,400 watts of microwave power to maintain a measured temperature of approximately 735° C. A 2 mm thick, 1 inch diameter preform consisting of silicon carbide particles required approximately 900 watts of microwave power to maintain a measured temperature of approximately 770° C.

The power required to maintain a specific temperature changes during consolidation as the thermal conductivity and radiation properties of the consolidating material change during the process. In experience with particles consolidated by the inventor, microwave power was initially fixed at 850 watts. Other initial power levels, and other variation of power levels applied during consolidation may be required or advisable in light of the requirements of specific applications or process variations.

After initial consolidation of the particulate preform article has been achieved and the preform article mass has acquired an enhanced degree of mechanical integrity (about twelve hours), the second stage of deposition includes rotating the support platform upon which the preform article rests. In a presently preferred embodiment, the rotational speed is between about 60 and 2,000 rpm, preferably about 300–600 rpm. In a presently preferred embodiment, the plasma may be simultaneously displaced from the center of the support platform to a position at about one half the radius of rotation of the preform article. The combination of rotation and plasma displacement provides more uniform heating of the preform article and leads to better deposition uniformity. In another preferred embodiment, the plasma position may be rapidly varied over the rotating or stationary reform through means of phase modulation of either or both the incident or reflected microwave energy which define the plasma location within the deposition chamber. This has the effect of increasing deposition area and uniformity.

As the mass and densification of the preform article increases, the heat flow from it increases. Microwave power is therefore increased to maintain the preform article temperature at between about 6000 and 850° C. A power level of about 1,200 watts is presently preferred for a preform diameter of 2.25 inches.

After continuation of the second deposition phase for between approximately 48 to 168 hours, depending on the degree of porosity desired, the preform thickness, particle size, and growth rate achievable under required process conditions, during which microwave power is increased to maintain sample temperature, deposition is terminated by switching off the microwave power supply and discontinuing the flow of methane gas. The excess methane gas may be removed from the chamber by momentarily opening a high flow rate valve between the chamber and the vacuum pump. The sample is allowed to cool, preferably under flowing hydrogen gas at a pressure of about 100 torr.

After cooling and removal from the reaction chamber, the silicon or other substrate support may be removed by etching. Where the support substrate is a silicon substrate, it may be dissolved in a 2:1 mixture by volume of concentrated reagent grade $HNO_3$ and HF, which is sufficient to remove the silicon substrate without attacking the densified ceramic diamond article.

Two diamond/non-diamond particle mixtures including $100\mu$ diamond particles intermixed with about 1 weight % of about $1\mu$ silicon carbide particles as nucleation aids were consolidated according to the present invention using slightly different process parameters. In the first process, 0.75 g of $1\mu$ silicon carbide particles, from Buehler Ltd., of Evanston Ill., comprising 1% by weight of the starting material were consolidated with 75 g of $100\mu$ N diamond particles from Flat-Tech Systems. A 3 mm thick preform having a 2.25 inch diameter was prepared as described above and placed in a CVD reactor. A gas mixture of 0.5 sccm $CH_4$ and 150 sccm $H_2$ was introduced in to the reactor at a pressure of 80 torr, and microwave power of 1500 watts was applied for a total time of 58.4 hours. After 2 hours, the workpiece was rotated at about 300 rpm for an additional 56.4 hours. The resulting composition was found to be hard, with considerable mechanical integrity. The top and side surfaces of the particulate preform could not readily be damaged by application of pressure with sharp probes. During exposure of the densified composite to mixed acids as described previously to free the composite from its silicon mold, no attack by the acids was noted on the composite, although the underlying silicon mold was rapidly and completely removed. After removal of the silicon mold, the surface of the composite adjacent to the polished silicon mold was found to be substantially smooth and hard, indicating that consolidation and densification processes had occurred at the region of the preform which was furthest from the plasma.

The composite dimensions and weight were measured and the densified article was found to be approximately 63% dense, based upon all assumption of 100% diamond composition of solid materials present. The composite was stressed to fracture, and scanning electron micrographs were taken of particles within the interior of the article. This inspection disclosed diamond growth over all of the interior particles.

In the second process, 0.75 g of $1\mu$ silicon carbide particles, from Buehler Ltd., of Evanston Ill., comprising 1% by weight of the starting material were consolidated with 75 g of $100\mu$ N diamond particles from Flat-Tech Systems. A 3 mm thick preform having a diameter measuring 2.25 inches was prepared as described above and placed in a CVD reactor. A gas mixture of 0.5 sccm $CH_4$ and 150 sccm $H_2$ was introduced in to the reactor at a pressure of 90 torr, and microwave power of 1800 watts was applied for a total time of 83.4 hours. After 1.5 hours, the workpiece was rotated at about 300 rpm for an additional 82 hours. The resulting composition was found to exhibit substantial mechanical integrity, and compared to the first composition, was similarly consolidated throughout its interior, ascertained after fracture of the densified article and scanning electron microscopy inspection.

Although the consolidation process proceeds most efficiently within the temperature ranges cited herein, it will be appreciated by those of ordinary skill in the art that the particulate preform temperature must be such as to be compatible with the thermal tolerance limits of the materials comprising the particulates. Thus, if aluminum particles are to be consolidated with diamond, it is desirable never to exceed approximately 450° C. to avoid softening and solid state diffusional bonding of the aluminum particles into a less penetrable mass. The consolidation process proceeds as at higher temperatures with other materials, subject to the expected reduction in growth rate of polycrystalline diamond at reduced temperatures for any given diamond growth process.

The composite articles of the present invention may be formed in holes or other recesses of non-diamond materials prepared by etching, drilling or otter mechanical processes to accept regions of diamond or non-diamond solid or composite particles. According to this aspect of the invention, a substrate material, such as silicon carbide, beryllium, aluminum, or other material compatible with diamond forming processes is prepared by forming one or more holes or other recesses. Particles to be consolidated are placed in the hole or recess and the loaded substrate material is placed in the diamond growth reactor. Consolidation of the particles is performed as disclosed herein. Wherein the substrate material is one to which deposited diamond will adhere, no other means need be used to secure the position of the consolidated mass in the hole or recess of the substrate material. Where the substrate material is one to which diamond has poor adhesion, the hole or recess can be formed using undercuts, i.e., its diameter increases with its depth below its surface. The diamond consolidated particle mass will be interlocked with the substrate material and thus be held thereto by a mechanically stable bond.

One limitation on the production of diamond consolidated particle compositions by chemical vapor infiltration is that there exists a limit on the thickness of the article which can be produced. This limitation occurs because, at some thickness determined by the particular process parameters in use, it is no longer possible to transport the necessary growth species from the surface of the article to its interior. This places limits on the commercial usefulness of diamond composite materials because there are items which, by their nature, require substantial section thicknesses for their manufacture. Examples of such articles which may require thick sections include turbine blades, meteorology gauge blocks, and ceramic vacuum tube envelopes.

According to another aspect of the present invention, articles having sectional portions of arbitrary thickness may be formed if the process is carried out by addition of new particulate material to the surface of the article undergoing consolidation. Such a process is illustrated in FIGS. 6a–6e, a series of cross sectional views of a diamond consolidated article at various points in the process.

Figure 6A:
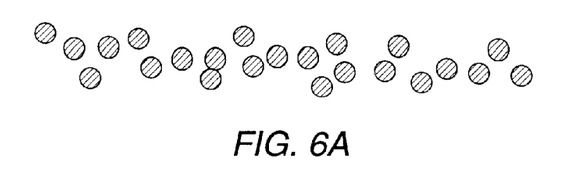
FIGS. 6a–6e are schematic representations of cross-sectional views of a diamond consolidated particle composition at various points in a fabrication process, illustrating a progressive process for forming thicker diamond consolidated particle compositions.
Figure 6B:
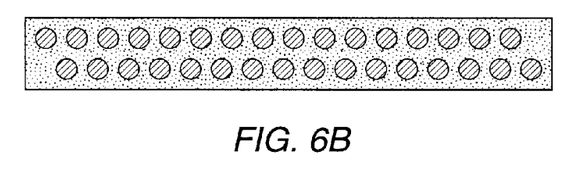

Referring first to FIG. 6a, the initially unconsolidated particles are shown formed into a preform of a desired shape. FIG. 6b shows the article after particle consolidation has been completed according to the teachings of the present invention.

Figure 6C:
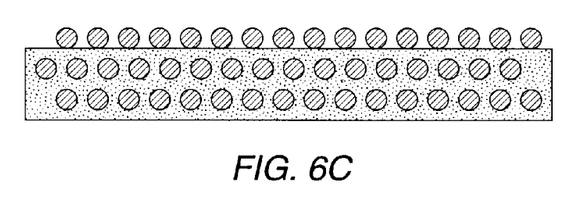
Figure 6D:
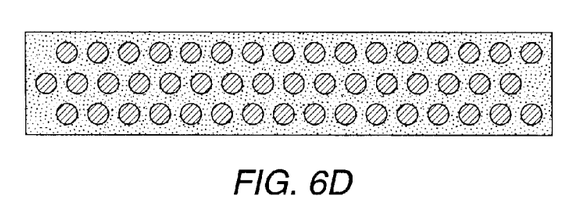

Next, as shown in FIG. 6c, additional particles are added to the surface of the now consolidated article and further particle consolidation of the newly placed particles is accomplished, resulting in the thicker consolidated article shown in FIG. 6d. It is presently contemplated that two possible modes of operation of this phase of the process are possible. In a first batch mode, the consolidated article of FIG. 6b is removed from the deposition chamber, or the chamber is at least opened, and the additional particles are placed on the surface of the article. The deposition chamber is then closed and further deposition is performed to consolidate the new particles. Performance of this variation in the process will result in discernable boundaries within the article at the locations across the cross section of the article representing the surfaces where the new particles were placed.

Figure 6E:
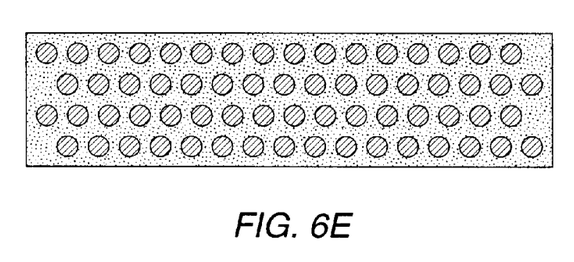

In certain applications, the boundaries within the article may have deleterious effects on the strength of the finished composite article. Where these features are undesirable in the finished article, a continuous process may be performed wherein additional particles are continuously added to the surface of the article at a rate determined by the progress of the consolidation process. For example, a consolidation process may be carried out in which particles to be consolidated are, dispensed in a slow continuous fashion using any of a number of particle dispenser mechanisms, including vibrating hoppers, impact hoppers, screw-driven particle feeds, or gas puff particle feeds. The particle feed rate is adjusted such that the average particle feed rate is not greater than the effective consolidation rate, i.e., such that particles are substantially fully incorporated into the underlying consolidated mass before an excessive depth of new particles are added. In this fashion, a continuous densified layer is formed by accretion of particles and infiltration of polycrystalline diamond matrix material. The particulars of particle feed rate are determined by such factors as matrix deposition rate, particle shape, particle size, and reaction temperature. A further advantage of continuous particle feed and consolidation is that the average depth of porous material which must be consolidated can be kept relatively shallow compared with the sections consolidated in batch processes, and therefore will be less subject to matrix material compositional variation with depth, producing a more uniform product.

Where batch processing is employed, the process steps illustrated by FIGS. 6c and 6d may be repeated as many times as necessary to obtain a finished article having a desired thickness as shown in FIG. 6e. Where continuous processing is utilized, the particle feed is stopped when enough material is present in the article to achieve the desired end thickness.

While a presently-preferred embodiment of the invention has been disclosed, those of ordinary skill in the art will, from an examination of the within disclosure and drawings be able to configure other embodiments of the invention. These other embodiments are intended to fall within the scope of the present invention, which is to be limited only by the scope of the appended claims.

What is claimed is:

1. An article comprising a preform of diamond particles consolidated with polycrystalline diamond, said polycrystalline diamond formed on regions of said particles not in contact with one another.

2. The article of claim 1 being substantially porous.

3. The article of claim 1 being substantially non-porous.

4. The article of claim 1 wherein at least some of said particles have a length/diameter ratio in excess of about 7/1.

5. An article comprising a preform of particles compatible with diamond deposition, said preform consolidated with polycrystalline diamond, said polycrystalline diamond formed on regions of said particles not in contact with one another.

6. The article of claim 5 being substantially porous.

7. The article of claim 5 being substantially non-porous.

8. The article of claim 5 wherein at least some of said particles have a length/diameter ratio in excess of about 7/1.

9. An article comprising a polycrystalline diamond compact consolidated with polycrystalline diamond, said polycrystalline diamond formed on regions of said particles not in contact with one another.

10. The article of claim 9 being substantially porous.

11. The article of claim 9 being substantially non-porous.

* * * * *